(12) United States Patent
Rohl

(10) Patent No.: US 7,103,515 B2
(45) Date of Patent: Sep. 5, 2006

(54) METHOD FOR ANALYZING TURBINE ENGINE DISKS

(75) Inventor: Peter Jurgen Rohl, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 864 days.

(21) Appl. No.: 09/681,838

(22) Filed: Jun. 14, 2001

(65) Prior Publication Data
US 2002/0029138 A1    Mar. 7, 2002

Related U.S. Application Data

(60) Provisional application No. 60/230,194, filed on Sep. 5, 2000.

(51) Int. Cl.
- G06F 7/60 (2006.01)
- G06F 17/10 (2006.01)
- G06F 19/00 (2006.01)
- G05B 13/02 (2006.01)

(52) U.S. Cl. .............. 703/2; 700/31; 700/97; 700/98; 700/119

(58) Field of Classification Search ............ 703/2; 716/4; 60/792; 700/31, 97, 98, 119
See application file for complete search history.

(56) References Cited

U.S. PATENT DOCUMENTS

| | | | |
|---|---|---|---|
| 5,133,182 A * | 7/1992 | Marcos ................ 60/792 |
| 5,808,617 A * | 9/1998 | Kenworthy et al. ........ 345/421 |
| RE36,602 E * | 3/2000 | Sebastian et al. ............ 700/97 |
| 6,202,043 B1 | 3/2001 | Devoino et al. |
| 6,434,441 B1 * | 8/2002 | Beauchamp et al. .......... 700/98 |
| 6,587,741 B1 * | 7/2003 | Chetta et al. .................. 700/97 |
| 6,625,507 B1 * | 9/2003 | Dickerson et al. ............ 700/97 |
| 6,813,749 B1 * | 11/2004 | Rassaian ......................... 716/4 |
| 6,856,842 B1 * | 2/2005 | Rebello et al. ............... 700/31 |

OTHER PUBLICATIONS

Artificial Intelligence (Understanding Computers), by Time-Life Books, 1986, ISBN 0-8094-5675-3, pp. 36-43.*

* cited by examiner

Primary Examiner—Paul L. Rodriguez
Assistant Examiner—Dwin M. Craig
(74) Attorney, Agent, or Firm—Fletcher Yoder

(57) ABSTRACT

The present invention provides, in one embodiment, a method for automatically analyzing an article of manufacture comprising the steps of a) providing a master model and a context model specification; b) creating a context model from the master model and the context model specification; c) translating the context model into an engineering analysis model compatible with an engineering analysis program; d) executing the engineering analysis program to generate a performance estimate form the engineering analysis model; and e) optionally modifying the master model to improve the performance estimate.

25 Claims, 2 Drawing Sheets

METHOD FOR ANALYZING TURBINE ENGINE DISKS

CROSS REFERENCE TO RELATED APPLICATIONS

This application claims priority from a Provisional Application entitled Method For Designing and Analyzing Turbine Engine Disks by Peter jürgen Röhl, Ser. No. 60/230,194 filed Sep. 5, 2000.

BACKGROUND OF INVENTION

This invention relates generally to engineering computer design and analysis tools, and more particularly to a process, a digital computer, and a medium readable by a digital computer for the engineering design and analysis of turbine engine disks.

Typically, a turbine engine disk design engineer uses a computer-aided design (CAD) system and one or more engineering analysis programs to design rotating turbine engine hardware. One typical engineering analysis program is a finite element analysis (FEA) package. The analysis process typically includes a simplified representation of the geometric shape. For every design iteration, the simplified representation of the geometry has to be regenerated. Typically, the design engineer gives the initial design to an analyst. The analyst converts the CAD model into a neutral geometric representation, for example, IGES (International Geometry Exchange Standard), which is then loaded into an engineering analysis package and is then manually simplified (e.g. trimming unwanted pieces to simplify the geometry) to the level of detail necessary for the analysis. However, if the simplified geometry of the design remains so extensive that it cannot be handled by the engineering analysis package, the analyst may choose to build the simplified geometry from scratch.

If the analyst finds that the part does not meet its requirements, for example, because stresses, displacements, or temperatures are too high, the designer will modify the geometry and complete another iteration of the process, which process is time consuming and vulnerable to errors introduced by operators restructuring the models.

Therefore, there is a need for a process that automates the generation of analysis models from CAD geometry models and provides a level of association between topological features of the CAD geometry and the corresponding regions of the analysis model.

SUMMARY OF INVENTION

The present invention provides, in one embodiment, a method for automatically designing an article of manufacture comprising the steps of a) providing a master model and a context model specification; b) creating a context model from the master model and the context model specification; c) translating the context model into an engineering analysis model compatible with an engineering analysis program; d) executing the engineering analysis program to generate a performance estimate form the engineering analysis model; and e) optionally modifying the master model to improve the performance estimate.

DETAILED DESCRIPTION

The present invention, by way of example and not limitation, is an automated process implemented on a digital computer for the design and engineering analysis of mechanical device parts, in particular complex rotating parts such as disks found in turbine engines.

Figure 1:
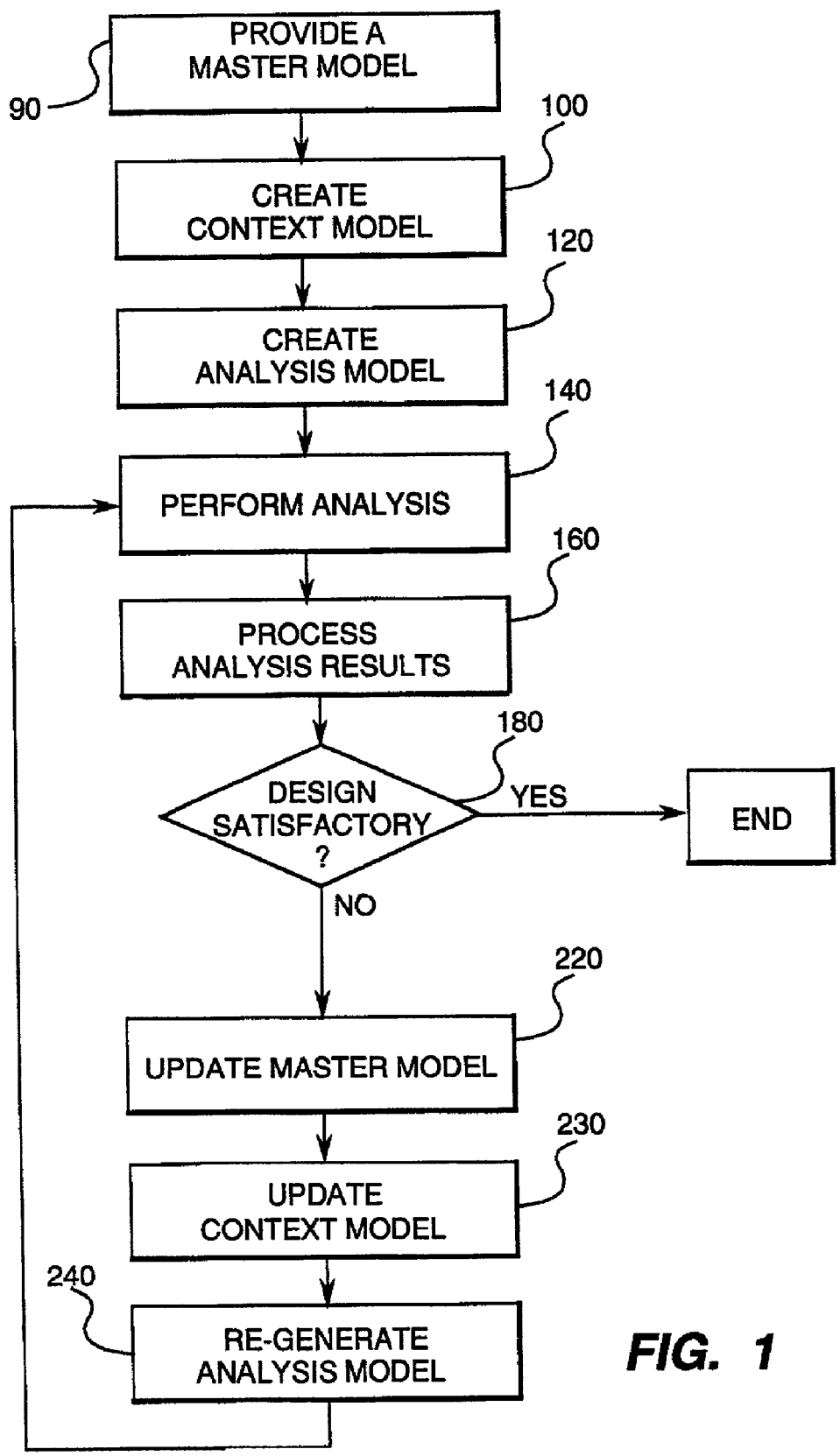
FIG. 1 shows a schematic block diagram (e.g., flow chart) of an implementation of the method of the invention for the analysis of an article of manufacture.

A flow chart representing one embodiment of the present invention is shown in the block diagram of FIG. 1. The input to the process is typically done in a digital computer using a computer aided design program (herein CAD). The CAD model (herein the master model) is obtained from a computer medium, for example a hard disk, in a form readable by a CAD program. The master model is defined as a parametric representation of a part usable within CAD software (e.g., commercially available examples of which are Unigraphics sold by Unigraphics Solutions, ProE sold by Parametric Technologies, CATIA sold by IBM/Dassault Systemes, I-DEAS sold by SDRC, etc.) in which part geometry is described in terms of features and dimensional parameters associated with these features. It will be appreciated that the geometric representation of the master model can be parametric or non-parametric.

In the first step of the process, the master model is read from an initial storage medium into the CAD program as represented by block 90 in FIG. 1. The master model generally represents the machine part to be modeled. In one embodiment, the master model may represent a compressor spool. comprising, for example, multiple disks and adjacent rotating hardware. In the next step 100 of the invention, a user determines a specified portion of master model (called the context model specification) to be copied into an associative model (called the context model) and prepared for engineering analysis. Associative, as used herein, means that there exists a master-slave relationship between the master model and the context model. In other words, the master model is abstracted to a level of detail necessary to perform a specified engineering analysis (e.g., the necessary detail may comprise only one specific part of a larger design assembly). For example, when modeling a turbine disk, if a specific portion of the disk (e.g., the disk nm or any other highly stressed region) is needed for analysis, it is abstracted from the master model into the context model (i.e., the context model is a subset of the master model).

In the next step of the invention as represented by block 120, the context model is translated into an engineering analysis compatible with an engineering analysis program. Typical engineering analysis programs, for example, provide algorithms for the solution of mechanical stress, heat transfer, modal analysis, buckling, and computational fluid dynamics problems. For example, an algorithm for the solution of mechanical stress in an engineering analysis program is used for analyzing a turbine disk rim exposed to high levels of stress. Such engineering analysis programs providing these type of algorithms may include, but are not limited to, ANSYS, ABAQUS and Star-CD™. Typical preparation of the context model 100 for engineering analysis includes, but is not limited to, de-featuring, simplification, trimming, 3d to 2d conversion, tagging and chunking (discussed below). The engineering analysis model, for example, is typically a finite element model comprising a finite element mesh having material information parameters and loads and boundary conditions.

In the next step of the invention as represented by block 140, analysis of the engineering analysis model to generate a performance estimate is performed by applying a finite element or alternatively a finite difference method, for example. The result of the analysis is typically, and without limitation, a binary data file. In one embodiment, as represented by block 160, the binary data file is processed to generate the performance estimate in a graphical or textual form, using at least one macro, so that an operator can analyze the results. In another embodiment, the binary data file is processed to generate the performance estimate in a form readable by a computer program, using at least one macro, so that the computer program, for example iSIGHT™, automatically analyzes the results. It will be appreciated that different types of analysis forms (e.g., graphs, charts, tables, worksheets, etc.), singly or in combination, may be used to display the data file in graphical or textual form. Typical data file output may include, but is not limited to, stresses, displacements, pressures, temperatures, velocities and the like. It will also be appreciated that at least one macro may be used in all design applications. Macro, as used herein, means a symbol, name, or key that represents a list of commands, actions, or keystrokes.

In the next step of the invention as represented by block 180, an automated computer program or alternatively an operator, for example, evaluates the processed results and determines whether the design is satisfactory. If the results of the evaluation are found to be satisfactory, the process of the present invention ends. However, if the results of the evaluation are not satisfactory, the automated computer program (e.g., iSIGHT™ by Engineous Software or ModelCenter™ by Phoenix Integration) or alternatively the operator, for example, selects a new set of geometry parameters which results in updating the master model (represented by block 220), updating the context model (represented by block 230), re-generating the analysis model (represented by block 240), and re-running the analysis of the new engineering analysis model (represented by block 140). It will be appreciated that updating the context model, as represented by block 230, occurs because the geometry and topology is controlled by the master model. In addition, it will be appreciated that re-generating that analysis model represented by block 240 involves the execution of existing macros created in the steps represented by blocks 600 and 610 (discussed below) and which macros do not need to be created again in subsequent iterations because the macros are dependent on the tagged geometry initially developed in the creation of the context model 100.

Figure 2:
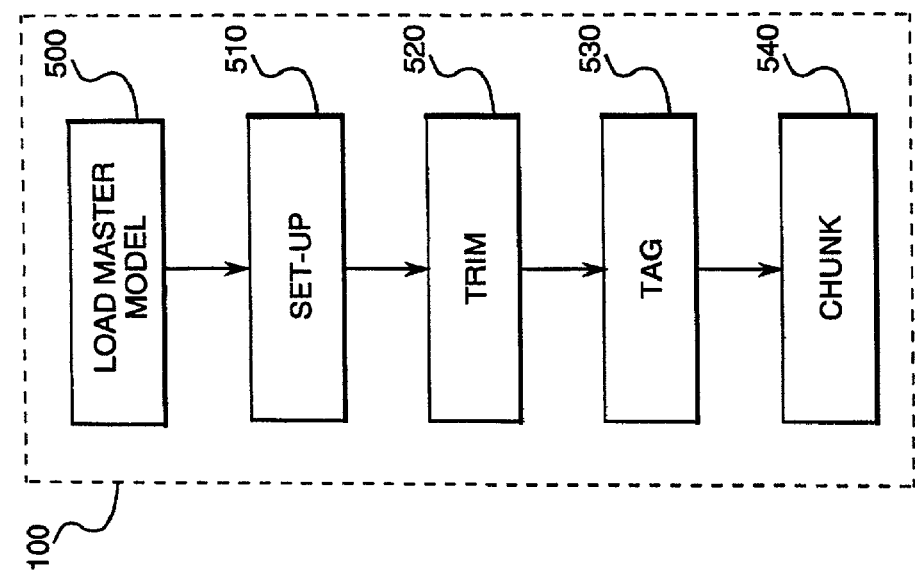
FIG. 2 is a flow chart expanding individual block 100 of FIG. 1.

In one embodiment, the loop represented by blocks 140 through 240 continues in iteration until a satisfactory design meeting required criteria is reached. Satisfactory design criteria for a turbine engine disk rim, for example, is a design that meets all imposed stress and displacement constraints. In an alternative embodiment, a pre-determined number of iterations (which can be the predetermined design criteria) of a design may be executed, as a result of time constraints for example, and the best design may be chosen from that number of iterations. It will be appreciated by those of ordinary skill in the art that the pre-determined number of iterations of a design may be one or more depending on the implementation. The process steps relating to the functions represented by block 100 are shown in more detail in FIG. 2. In the first step represented by block 500, the master model 90 is loaded into the CAD program. Next, the "Set-up" step, represented by block 510, generates an associative copy of the master model. One of ordinary skill in the art will appreciate that the context model may or may not be stored in the same physical file on the computer medium as the master model depending on the CAD system used. In addition, the step represented by block 100 may include one, all or a combination of the steps comprising Trim, Tag and Chunk, represented by blocks 520, 530 and 540, respectively. The step represented by block 520 includes trimming the associative copy of the geometry of the master model to a region of interest. "Trim", as used herein, means to cut away parts of the associative copy of the geometry that are not needed for engineering analysis. The step represented by block 530 includes tagging the associative copy of the geometry after being trimmed. "Tagging", as used herein, means applying unique identifiers to topological entities (e.g., solid bodies, faces, edges, etc.) which are later to be used by the engineering analysis program to perform the analysis (see block 140). Typically, the tags can be names or name-value pairs, where the names and values will have some meaning for the engineering analysis program. For example, a name titled Pressure_Face may be used for a face where the engineering analysis code needs to apply a pressure. A name-value pair, for example, may be temp123=1250.0 which applies to a region where the engineering analysis code needs to apply a temperature boundary condition with a value of 1250.0. "Chunking", as used herein, means subdividing the associative copy of the geometry into a collection of simple shapes (e.g., for example six-sided volumes) where the boolean sum of the simple shapes make up the original shape and where each shape contains the full information of the parent geometry. It will be appreciated by one of ordinary skill in the art that the spatial relationship between the geometries of the master model and the simple shapes of the context model is retained by using a method of assembly functionality. "Assembly functionality", as used herein, means the ability of a CAD system to handle spatial relationships between parts. A system that offers such functionality, for example, is Unigraphics™ sold by Unigraphics Solutions. One purpose of chunking, for example, is to simplify discretization for engineering analysis. "Discretization", as used herein, means subdividing the parametric shape into pieces small enough to allow the field quantities of interest to be approximated by using polynomials, for example. Types of discretization, may include, but are not limited to, meshing used in finite element analysis (FEA) programs or gridding used in computational fluid dynamics (CFD) programs. In one embodiment, the steps represented by blocks 530 and 540 can be executed in any order after the step represented by block 520. In an alternative embodiment, the step represented by block 530 can be executed in any order after the execution of the step represented by block 510.

Figure 3:
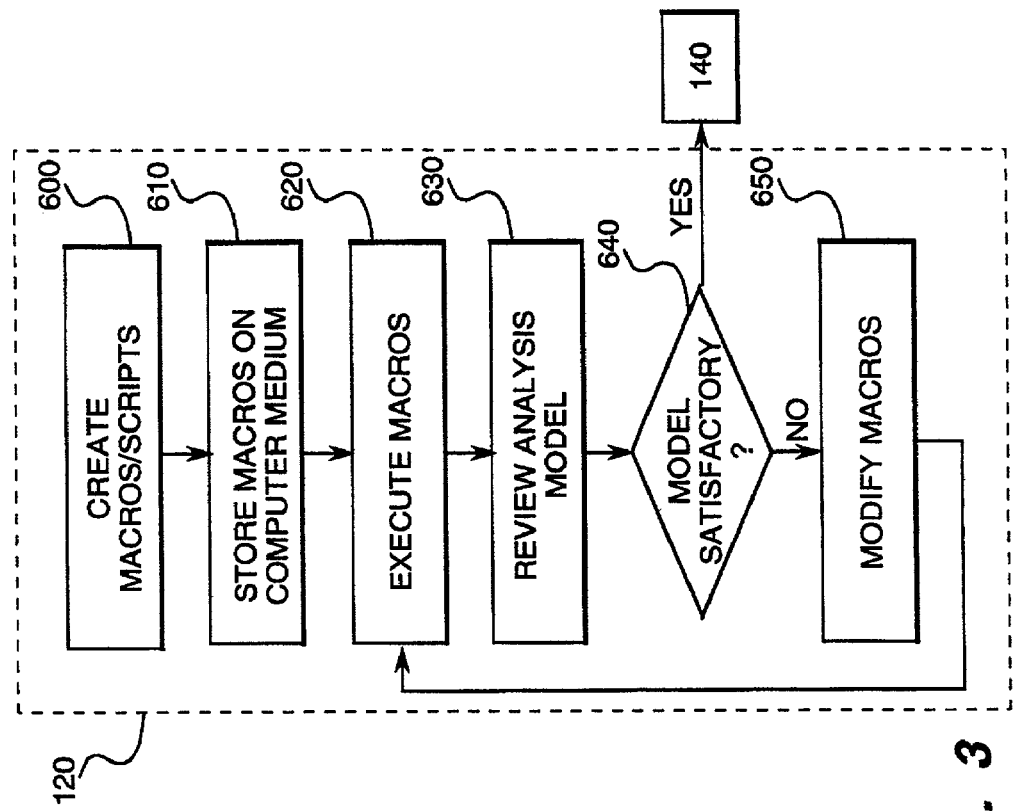
FIG. 3 is a flow chart expanding individual block 120 of FIG. 1.

The process steps relating to the functions represented by block 120 are shown in more detail in FIG. 3. Macros are initially developed 600 to translate the context model. "Translating", as used herein, is the use of the macro to load (translate) the context model, which includes the geometric shapes and tags from the CAD model developed in step 100, and generate from the context model an engineering analysis model compatible with an engineering analysis program. As discussed above, typical engineering analysis programs may include, but are not limited to, ANSYS, ABAQUS and Star-CD™. In such programs, for example, the translating macros perform discretization (as described above), application of material information, application of boundary conditions and application of load conditions. Other forms of translating may include identifying standard shapes and loadings for which closed form engineering solutions are known. Next, the step represented by block 610 includes storing the macros in a computer medium. Typical languages for macros include, but are not limited to, parametric design language for ANSYS (APDL). In the step represented by block 620, the macros are executed to generate the engineering analysis model which is subsequently reviewed by the operator (represented by block 630). If the engineering analysis model is found to be satisfactory, analysis 140 of the engineering analysis model is performed (see FIG. 1). However, if the engineering analysis model is not satisfactory 640 because of distorted elements in that model, for example, the operator modifies 650 one or more of the engineering analysis model generation macros (see FIG. 3). The process then loops back to block 620. It will be appreciated by one of ordinary skill in the art that by using an automated computer, the loop involving executing the macros 620 to modifying the macros 650 is done automatically as compared to using an operator whose review is time consuming and vulnerable to errors in restructuring the model.

It will be apparent to those skilled in the art that, while the invention has been illustrated and described herein in accordance with the patent statutes, modification and changes may be made in the disclosed embodiments without departing from the true spirit and scope of the invention. It is, therefore, to be understood that the appended claims are intended to cover all such modifications and changes as fall within the true spirit of the invention.

The invention claimed is:

1. A method for automatically analyzing an article of manufacture comprising:
   a) providing a master model and a context model specification;
   b) creating a context model from said master model and said context model specification;
   c) translating said context model into an engineering analysis model compatible with an engineering analysis program;
   d) executing said engineering analysis program to generate a performance estimate from said engineering analysis model; and
   e) optionally modifying said master model to improve said performance estimate, wherein the step of modifying said master model to improve said performance estimate comprises using a finite element method.

2. The method of claim 1, wherein said step of creating a context model comprises creating an associative copy from said master model.

3. The method of claim 1, wherein said step of creating a context model further comprises chunking.

4. The method of claim 1, wherein said step of creating a context model further comprises trimming.

5. The method of claim 1, wherein said step of creating a context model further comprises tagging.

6. The method of claim 1, wherein the step of translating said context model into an engineering analysis model comprises generating at least one macro file.

7. method of claim 1, wherein the step of modifying said master model to improve said performance estimate comprises using a finite difference method.

8. The method of claim 1, wherein said master model represents a compressor spool.

9. The method of claim 8, wherein said compressor spool comprises multiple disks and adjacent rotating hardware.

10. A method for automatically analyzing a turbine engine disk comprising:
    a) loading a turbine disk CAD model from a database;
    b) acquiring a geometric description of a region of interest from an user;
    c) creating a context model from said geometric description and said CAD model by trimming, tagging and chunking;
    d) generating a mesh from said context model;
    e) executing an engineering analysis program using said mesh to generate a performance estimate;
    f) optionally modifying said turbine disk CAD model to improve said performance estimate.

11. The method of claim 10, wherein said step of creating a context model comprises creating an associative copy from said master model.

12. The method of claim 10, wherein said step of creating a context model further comprises chunking.

13. The method of claim 10, wherein said step of creating a context model further comprises trimming.

14. The method of claim 10, wherein said step of creating a context model further comprises tagging.

15. The method of claim 10, wherein the step of translating said context model into an engineering analysis model comprises generating at least one macro file.

16. The method of claim 10, wherein the step of modifying said master model to improve said performance estimate comprises using a finite element method.

17. The method of claim 10, wherein the step of modifying said master model to improve said performance estimate comprises using a finite difference method.

18. The method of claim 10, wherein said master model represents a compressor spool.

19. The method of claim 18, wherein said compressor spool comprises multiple disks and adjacent rotating hardware.

20. A method for automatically analyzing an article of manufacture comprising:
    a) providing a master model and a context model specification;
    b) creating a context model from said master model and said context model specification, wherein said step of creating a context model further comprises chunking, or trimming, or tagging, or a combination thereof
    c) translating said context model into an engineering analysis model compatible with an engineering analysis program;
    d) executing said engineering analysis program to generate a performance estimate from said engineering analysis model; and
    e) optionally modifying said master model to improve said performance estimate.

21. A method for automatically analyzing an article of manufacture comprising:
    a) providing a master model and a context model specification;
    b) creating a context model from said master model and said context model specification;
    c) translating said context model into an engineering analysis model compatible with an engineering analysis program;
    d) executing said engineering analysis program to generate a performance estimate from said engineering analysis model; and
    e) optionally modifying said master model to improve said performance estimate, wherein the step of modifying said master model to improve said performance estimate comprises using a finite difference method.

22. The method of claim 20, wherein said step of creating a context model includes chunking.

23. The method of claim 20, wherein said step of creating a context model includes tagging.

24. The method of claim 20, wherein said step of creating a context model includes trimming.

25. The method of claim 20, wherein said step of creating a context model includes chunking, trimming, and tagging.

* * * * *